United States Patent
Iacoponi et al.

[11] Patent Number: 6,048,790
[45] Date of Patent: Apr. 11, 2000

[54] METALORGANIC DECOMPOSITION DEPOSITION OF THIN CONDUCTIVE FILMS ON INTEGRATED CIRCUITS USING REDUCING AMBIENT

[75] Inventors: John A. Iacoponi, San Jose; Eric N. Paton, Morgan Hill, both of Calif.

[73] Assignee: Advanced Micro Devices, Inc., Sunnyvale, Calif.

[21] Appl. No.: 09/113,436

[22] Filed: Jul. 10, 1998

[51] Int. Cl.$^7$ .................................................. H01L 21/44
[52] U.S. Cl. ........................ 438/643; 438/627; 438/653
[58] Field of Search .................... 438/627, 643, 438/653

[56] References Cited

U.S. PATENT DOCUMENTS 5,866,205  2/1999  Vaartstra et al. ..................... 427/255.1
5,924,012  7/1999  Vaartstra ................................. 438/681

OTHER PUBLICATIONS

J.V. Mantese, A.L. Micheli, A. H. Hamdi, and R.W. West, *Metalorganic Deposition (MOD): A Nonvacuum Spin–on, Liquid–Based, Thin Film Method*, MRS Bulletin, Oct. 1989, pp. 48–53.

B.A. Tuttle and R.W. Schwartz, *Solution Deposition of Ferroelectric Thin Films*, MRS Bulletin, Jun. 1996, pp. 49–54.

G.T. Kraus, C.S. Oldweiler, and E.P. Giannelis, *Synthesis and Oxidation Kinetics of Sol–Gel and Sputtered Tantalum Nitride Thin Films*, Mat. Res. Soc. Symp. Proc., vol. 410, 1996, Materials Research Society, pp. 295–300.

*Primary Examiner*—Charles Bowers
*Assistant Examiner*—Lisa Kilday
*Attorney, Agent, or Firm*—Monica H. Choi

[57] ABSTRACT

A method for depositing conductive material inside openings within an integrated circuit uses chemical solution deposition. The method includes applying the integrated circuit having the openings with a metalorganic decomposition precursor. The metalorganic decomposition precursor on the integrated circuit is pyrolyzed in a reducing ambient to form a layer of conductive material. For example, if the reducing ambient includes one of hydrogen gas, or a hydrogen and nitrogen gas mix, reactive hydrogen, or ultra high vacuum substantially devoid of oxygen, a conductive layer of metal forms from pyrolyzing the metalorganic decomposition precursor in such a reducing ambient. If the reducing ambient includes reactive nitrogen, a conductive layer of metal nitride forms from pyrolyzing the metalorganic decomposition precursor in such a reducing ambient. The present invention which uses metalorganic decomposition precursors which are chemical solutions with high wetability may be used to particular advantage for depositing a barrier layer and copper within small geometry openings for metal interconnects.

10 Claims, 2 Drawing Sheets

METALORGANIC DECOMPOSITION DEPOSITION OF THIN CONDUCTIVE FILMS ON INTEGRATED CIRCUITS USING REDUCING AMBIENT

TECHNICAL FIELD

This invention relates to integrated circuits, and more particularly, to a method for depositing thin conductive films on integrated circuits using metalorganic decomposition deposition with a reducing ambient.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Deposition of a thinner conductive film which thoroughly covers the bottom and corner of small-geometry openings in integrated circuits is becoming critical for scaling down of IC dimensions. A recent need for thin conductive films is for a barrier layer between copper interconnect and insulating material. In metallization for interconnects, as the dimension of metal lines are scaled down, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

However, copper is a mid-bandgap impurity in silicon. Furthermore, the presence of copper in an insulating layer may also degrade the insulating properties of the insulating layer. Thus, diffusion of copper into an active device area in silicon or an insulating layer may degrade the performance of the integrated circuit. Nevertheless, use of copper metallization is desirable for further scaling down integrated circuit dimensions because of the lower bulk resistivity and the higher electromigration tolerance of copper.

Thus, a conductive film is deposited as a barrier layer between copper and the insulating layer to impede diffusion of copper into the insulating layer. As integrated circuit dimensions are scaled down, a thinner barrier layer is desirable.

The present invention is described with depositing conductive material to fill a dual damascene opening having a trench line and a via hole for integrated circuit interconnect metallization. However, as would be apparent to one of ordinary skill in the art, the present invention may be used for depositing conductive material for any application within an integrated circuit.

As an integrated circuit is scaled down, metallization, which connects devices on the integrated circuit, is also scaled down. Metal lines having copper for scaled-down integrated circuits are fabricated using a damascene process. A trench line or a via hole or any other opening is filled with metal or any other conductive material. For damascene metallization openings, the surface of the integrated circuit is then polished to form conductive lines with the conductive material contained within the trench lines.

Referring to FIG. 1, integrated circuits typically include multi-level metallization, and FIG. 1 shows a cross-section of a multi-level dual damascene metallization opening having a trench line and a via hole for integrated circuit metallization. A first metal line is contained within a first trench opening 102 etched in a first trench insulating layer 103 deposited on a substrate layer 104. A second metal line is contained within a second trench opening 105 in a second trench insulating layer 106. The second metal line is disposed on a different metallization level from the first metal line.

A via interconnects the metal lines on the two different metallization levels. A via plug is comprised of a conductive material and is disposed within a via hole 108 etched in a via insulating layer 110. FIG. 2 shows a top view of the dual damascene opening of FIG. 1, with the dual damascene cross-section of FIG. 1 being across line AA of FIG. 2.

The insulating layers 106 and 110 are comprised of any insulating material such as any form of oxides as is known to one of ordinary skill in the art. The conductive material filling the trench line 105 and the via hole 108 is commonly copper for scaled-down integrated circuits. To prevent diffusion of copper into the surrounding insulating layer, a barrier layer 112 comprised of a conductive film is deposited between the copper and the insulating layers 106 and 110. (Note, the first metal line within the first trench opening 102 may also be copper. In that case, a barrier layer is deposited between the first metal line and the first trench insulating layer 103. Such a barrier layer is not shown in FIG. 1 for clarity of illustration.)

As integrated circuits are scaled down, a process for easily and economically depositing conductive material, including a thin conductive film for the barrier layer 112 and the copper fill within the trench opening 105 and the via hole 108 having small dimensions, is desired. Prior art methods for depositing such conductive material include physical vapor deposition (PVD) and chemical vapor deposition (CVD) as known to one of ordinary skill in the art of integrated circuit fabrication. However, such prior art methods do not fully deposit conductive material into the bottom and corners of small-geometry openings. In addition, CVD techniques sometimes require high processing temperature and high-cost chemical ingredients, and CVD techniques sometimes result in high resistivity compound formation.

SUMMARY OF THE INVENTION

Accordingly, the present invention provides an efficient and economical process for depositing conductive material in scaled down integrated circuits using chemical solution deposition (CSD).

In a general aspect, the present invention is a method for depositing a barrier layer on an integrated circuit. This method includes the step of coating the integrated circuit with a metalorganic decomposition precursor. The metalorganic decomposition precursor deposited on the integrated circuit is then pyrolyzed in a reducing ambient to form the barrier layer.

The present invention may be used to particular advantage when the metalorganic decomposition precursor is a titanium metalorganic decomposition precursor, and when the titanium metalorganic decomposition precursor is pyrolyzed in the reducing ambient having a selected one of hydrogen gas, or a hydrogen and nitrogen gas mix, or reactive hydrogen, or an ultra high vacuum substantially devoid of oxygen, to form a layer of titanium metal as the barrier layer.

Alternatively, the present invention may be used to particular advantage when the metalorganic decomposition precursor is a titanium metalorganic decomposition precursor, and when the titanium metalorganic decomposition precursor is pyrolyzed in the reducing ambient having reactive nitrogen to form a layer of titanium nitride as the barrier layer.

Also, the present invention may be used to particular advantage when the metalorganic decomposition precursor is a tantalum metalorganic decomposition precursor, and when the tantalum metalorganic decomposition precursor is pyrolyzed in the reducing ambient having a selected one of hydrogen gas, or a hydrogen and nitrogen gas mix, or a hydrogen plasma, or an ultra high vacuum substantially devoid of oxygen, to form a layer of tantalum metal as the barrier layer.

In addition, the present invention may be used to particular advantage when the metalorganic decomposition precursor is a tantalum metalorganic decomposition precursor, and when the tantalum metalorganic decomposition precursor is pyrolyzed in the reducing ambient having reactive nitrogen to form a layer of tantalum nitride as the barrier layer.

In another aspect, the present invention is a method for depositing a layer of titanium, tantalum, or copper metal for any integrated circuit application. The method includes the step of coating the integrated circuit with a titanium, tantalum, or copper metalorganic decomposition precursor. Then, such a metalorganic decomposition precursor is pyrolyzed in a reducing ambient to form the layer of titanium, tantalum, or copper metal.

These and other features and advantages of the present invention will be better understood by considering the following detailed description of the invention which is presented with the attached drawings.

BRIEF DESCRIPTION OF THE DRAWINGS

FIG. 4, including

The figures referred to herein are drawn for clarity of illustration and are not necessarily drawn to scale. Moreover, the figures referred to herein focus on structures that are part of a larger integrated circuit. Elements having the same reference number in FIGS. 1–4 refer to elements having similar structure and function.

DETAILED DESCRIPTION

Chemical solution deposition refers to all solution-based chemical processing techniques for the synthesis of ceramic and metal thin films. Chemical solution deposition is especially amenable for depositing conductive material within small-geometry openings in an integrated circuit. With the high wetability from using chemical solutions, the bottom and corners of small-geometry openings are better covered with a solution precursor.

Figure 1:
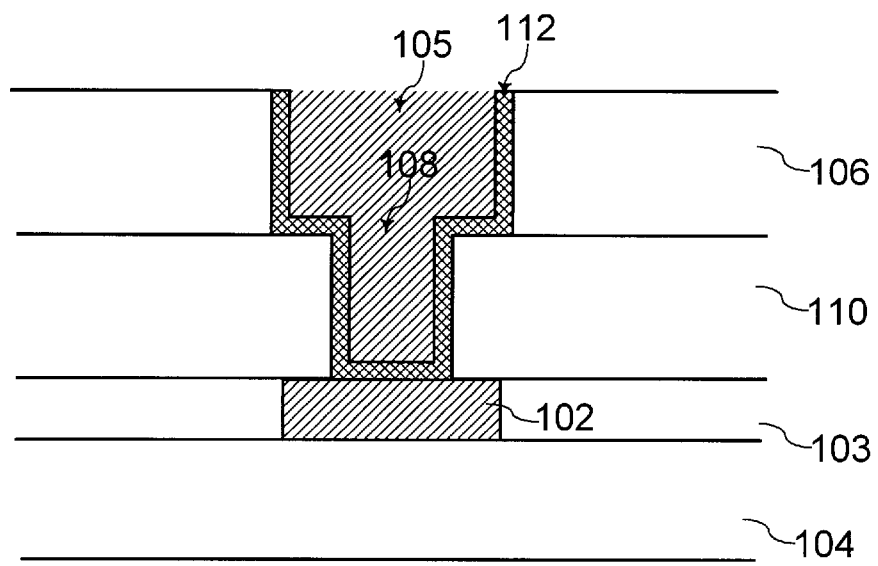
FIG. 1 shows a cross-sectional view of a dual damascene interconnect on an integrated circuit.
Figure 2:
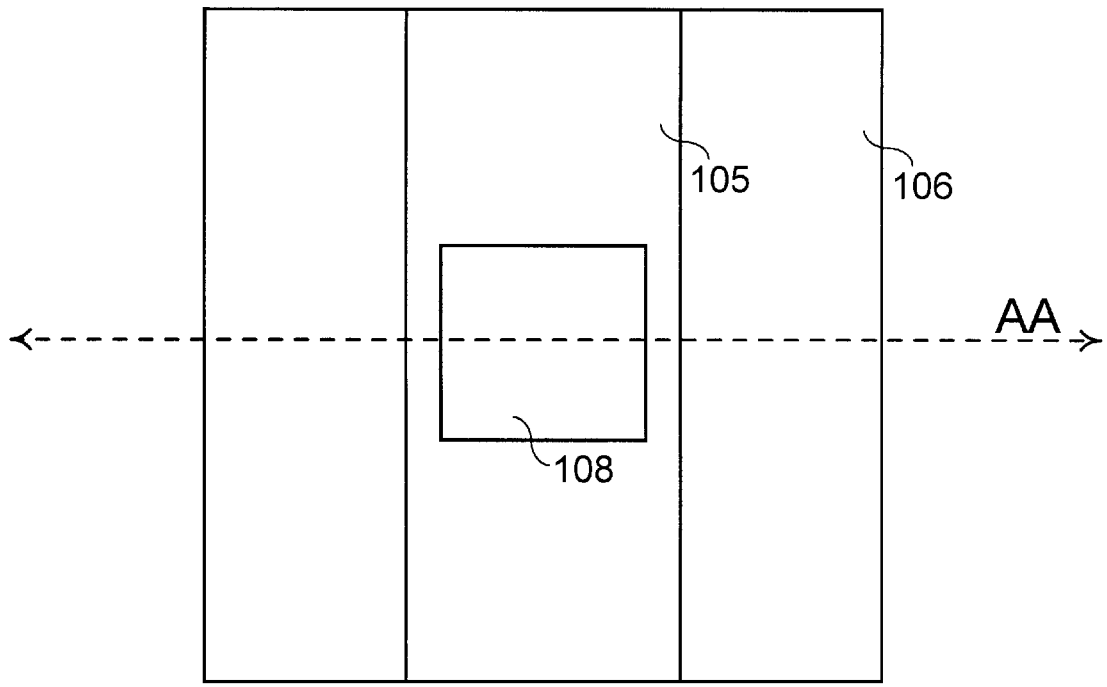
FIG. 2 shows a top view of the dual damascene interconnect of FIG. 1.

In addition, thinner conductive films may be deposited using chemical solution deposition. Referring to FIG. 1, a thinner conductive film for the barrier layer 112 is advantageous for small-geometry integrated circuits because a thinner barrier layer 112 allows more copper to be filled in the metal interconnect resulting in lower line resistance.

The present invention uses metalorganic decomposition techniques which are categorized as chemical solution deposition techniques for forming conductive thin films. In the prior art in contrast, such techniques have been predominantly used to deposit insulating layers.

Figure 3:
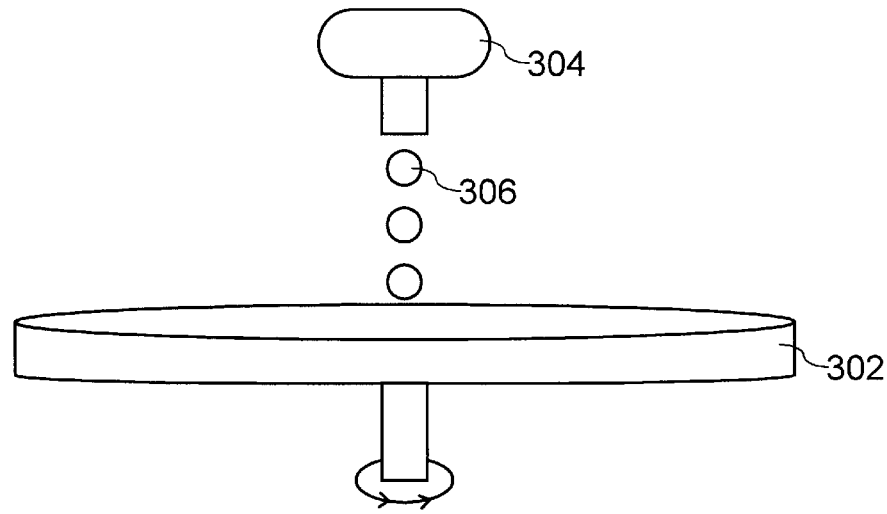
FIG. 3 shows a mechanism for applying a metalorganic decomposition precursor on the integrated circuit, according to the present invention.

Referring to FIG. 3, during an integrated circuit fabrication process, a wafer 302 having the integrated circuit is coated with a metalorganic decomposition precursor 306. A dispensing mechanism 304 dispenses the metalorganic decomposition precursor 306 onto the integrated circuit on the wafer 302. The dispensing mechanism 304 may include an atomized spraying unit or a liquid dripping unit as is known to one of ordinary skill in the art of integrated circuit fabrication. In addition, the wafer 302 is spun at speeds of several hundred or thousand rotations per minute (RPM) for improved uniformity of application of the metalorganic decomposition precursor 306.

Referring to FIG. 1, the present invention is described with depositing conductive material to fill a dual damascene opening having a trench opening and a via hole for integrated circuit interconnect metallization. However, as would be apparent to one of ordinary skill in the art, the present invention may be used for depositing conductive material for any application within an integrated circuit.

Referring to FIG. 1, for example, the conductive film for the barrier layer 112 may be titanium metal or titanium nitride. In that case, the metalorganic decomposition precursor 306 is a titanium metalorganic decomposition precursor. Alternatively, the conductive film for the barrier layer 112 may be tantalum metal or tantalum nitride. In that case, the metalorganic decomposition precursor 306 is a tantalum metalorganic decomposition precursor.

An example titanium metalorganic decomposition precursor is titanium dimethoxy dineodecanoate with chemical formula $Ti(OCH_3)_2(C_9H_{19}COO)_2$, and an example tantalum metalorganic decomposition precursor is tantalum trimethoxy dineodecanoate with chemical formula $Ta(OCH_3)_3(C_9H_{19}COO)_2$. Such metalorganic decomposition precursors are available, for example, from Chemat Tech, Inc., located in Northridge, Calif.

Aside from these examples of long chain carboxylate compound precursors for metalorganic decomposition, other solution preparation approaches for preparing the metalorganic decomposition precursors may be used. Other examples of solution preparation approaches include (1) sol-gel processes that use 2-methoxy-ethanol as a reactive solvent, and (2) hybrid processes that use chelating agents such as acetic acid or diethanolamine to reduce alkoxide reactivity. In addition, other solutions or solution preparation techniques, as known to one of ordinary skill in the art may be used. Alternatively, the solution properties of the precursor may be modified by methods known to one of ordinary skill in the art of integrated circuit fabrication. An example method of modifying the solution properties includes the addition of solvents, such as xylene.

Figure 4A:
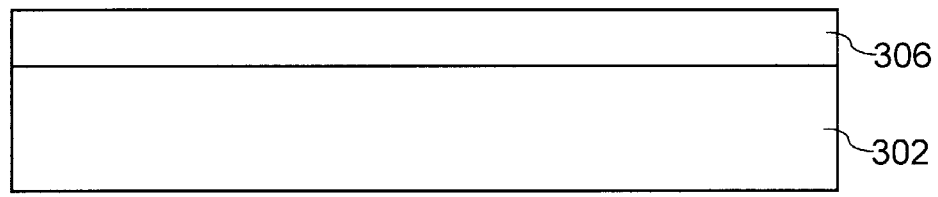
FIG. 4A and FIG. 4B, shows the step of pyrolyzing the metalorganic decomposition precursor in a reducing ambient, according to the present invention.
Figure 4B:
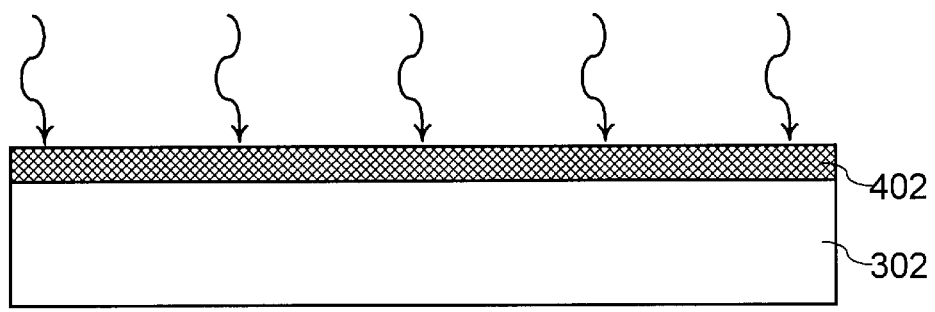

Referring to FIG. 1, to deposit the barrier layer 112, the metalorganic decomposition precursor 306 is applied on the integrated circuit 302 after the openings for the trench line 105 and the via hole 108 have been formed on the integrated circuit 302. Referring to FIGS. 4A and 4B, once the integrated circuit 302 is coated with the metalorganic decomposition precursor 306, the metalorganic decomposition precursor 306 is pyrolyzed in a reducing environment according to the present invention.

In the prior art, metalorganic decomposition processes are used in an oxidizing environment to form metal oxide as an insulating layer. In contrast, the present invention uses a reducing environment to form a conductive layer. To provide a reducing environment, the ambient in which the wafer 302 is disposed is controlled to have low oxygen ($O_2$) content. In addition, the ambient is controlled to carry reducing agents such as hydrogen gas ($H_2$), or a hydrogen and nitrogen gas mix ($H_2/N_2$), or reactive hydrogen and/or reactive nitrogen, or an ultra low vacuum ambient substantially devoid of oxygen (i.e., with less than $10^{-8}$ torr oxygen partial pressure).

Referring to FIG. 4B, with such a reducing ambient and with heating of the wafer 302 to typically about 400° C., the carrier solution of the metalorganic decomposition precursor is volatized and evaporates. Furthermore, especially with the reducing ambient, a layer of conductive material 402 forms on the integrated circuit 302. (Note that while the integrated circuit 302 is heated and while the metalorganic precursor 306 is being applied to the wafer having the integrated circuit 302, the wafer may be blanketed with an ambient of inert gases to prevent oxidation of the metalorganic precursor. Also note, a reducing ambient having reactive hydrogen and/or reactive nitrogen such as a plasma with hydrogen and/or nitrogen may be sufficiently reducing without heating up the wafer 302.) If a selected one of hydrogen gas ($H_2$), or a hydrogen and nitrogen gas mix ($H_2/N_2$), or reactive hydrogen, or an ultra high vacuum substantially devoid of oxygen, is used, then a conductive layer of metal film is formed as a result of the pyrolysis step. For example, if the metalorganic decomposition precursor 306 is a titanium metalorganic decomposition precursor (such as $Ti(OCH_3)_2(C_9H_{19}COO)_2$), a reducing ambient having a selected one of hydrogen gas ($H_2$), or a hydrogen and nitrogen gas mix ($H_2/N_2$), or reactive hydrogen, or ultra high vacuum substantially devoid of oxygen, causes a layer of titanium metal to be deposited after the pyrolysis step. If the metalorganic decomposition precursor 306 is a tantalum metalorganic decomposition precursor (such as $Ta(OCH_3)_3(C_9H_{19}COO)_2$), a reducing ambient having hydrogen gas ($H_2$), or a hydrogen and nitrogen gas mix ($H_2/N_2$), or reactive hydrogen, or ultra high vacuum substantially devoid of oxygen, causes a layer of tantalum metal to be deposited after the pyrolysis step.

If reactive nitrogen (in a form, such as a nitrogen plasma, known to one of ordinary skill in the art of chemistry) is used in the reducing ambient, then a conductive layer of metal nitride film is formed as a result of the pyrolysis step. For example, if the metalorganic decomposition precursor 306 is a titanium metalorganic decomposition precursor (such as $Ti(OCH_3)_2(C_9H_{19}COO)_2$), a reducing ambient having reactive nitrogen causes a layer of titanium nitride to be deposited after the pyrolysis step. If the metalorganic decomposition precursor 306 is a tantalum metalorganic decomposition precursor (such as $Ta(OCH_3)_3(C_9H_{19}COO)_2$), a reducing ambient having reactive nitrogen causes a layer of tantalum nitride to be deposited after the pyrolysis step.

Any of these conductive layers, whether a layer of titanium, titanium nitride, tantalum, or tantalum nitride, are amenable for use as the barrier layer 112 of FIG. 1. The barrier layer 112 formed in this manner is especially suitable for small-geometry integrated circuit fabrication. Because of the high wetability of chemical solutions such as the metalorganic decomposition precursors, the barrier layer 112 formed in this manner easily covers the bottom and corners of openings in small-geometry integrated circuits having relatively high aspect ratio (defined as the depth over the width of an opening). Moreover, using chemical solutions, thinner conductive layers are controllably deposited.

In addition to deposition of the barrier layer 112 of FIG. 1, the copper within the trench line 105 and the via hole 108 may also be deposited using metalorganic decomposition in a reducing ambient. Referring to FIGS. 3 and 4, the integrated circuit is covered with a copper metalorganic decomposition precursor such as copper dimethoxy diethoxide with chemical formula $Cu(OCH_2)_2(CH_2OCH_3)_2$. The integrated circuit is then pyrolyzed in a reducing ambient having a reducing agent such as hydrogen gas ($H_2$), or a hydrogen and nitrogen gas mix ($H_2/N_2$), or reactive hydrogen, or ultra high vacuum substantially devoid of oxygen. As a result, a conductive layer of copper metal forms after the pyrolysis step.

The copper may thus be deposited after the metalorganic decomposition deposition for the barrier layer 112. After the copper is thus deposited, the surface of the integrated circuit is polished to planarize the surface of the integrated circuit and to define the metal-lines to be contained within the trench line 105 using conventional chemical-mechanical polishing techniques for damascene metallization.

Depositing copper within the trench opening 105 and the via hole 108 in this manner is advantageous for small-geometry integrated circuits. The high wetability of the metalorganic decomposition precursors allows the bottom and corners of the high aspect ratio openings to be filled resulting in low resistance interconnects.

The foregoing is by way of example only and is not intended to be limiting. For example, the present invention may be used for depositing any type of conductive material for any type of integrated circuit application. In addition, any reducing agent aside from just the examples of hydrogen gas, reactive hydrogen and/or reactive nitrogen, or a hydrogen and nitrogen gas mix, or an ultra high vacuum substantially devoid of oxygen, may be used. The invention is limited only as defined in the following claims and equivalents thereof.

We claim:

1. A method for depositing a layer of conductive material on an integrated circuit, the method including the steps of:

A. coating the integrated circuit with a liquid metalorganic decomposition precursor, wherein said metalorganic decomposition precursor is comprised as a liquid solution that is coated on the integrated circuit; and B. pyrolyzing the liquid metalorganic decomposition precursor coated on the integrated circuit in a reducing ambient having at least one reducing chemical agent to form the layer of conductive material from chemical reduction of said liquid metalorganic decomposition precursor coated on the integrated circuit with said at least one reducing chemical agent.

2. The method of claim 1, wherein the liquid metalorganic decomposition precursor is a titanium metalorganic decomposition precursor, and wherein step B further includes a step of pyrolyzing the titanium metalorganic decomposition precursor in the reducing ambient having selected at least one of hydrogen gas, a hydrogen and nitrogen gas mix, reactive hydrogen, as said reducing chemical agent, and an ultra high vacuum substantially devoid of oxygen, to form a layer of titanium metal as the layer of conductive material.

3. The method of claim 1, wherein the liquid metalorganic decomposition precursor is a titanium metalorganic decomposition precursor, and wherein step B further includes a step of pyrolyzing the titanium metalorganic decomposition precursor in the reducing ambient having reactive nitrogen, as said reducing chemical agent, to form a layer of titanium nitride as the layer of conductive material.

4. The method of claim 1, wherein the liquid metalorganic decomposition precursor is a tantalum metalorganic decomposition precursor, and wherein step B further includes a step of pyrolyzing the tantalum metalorganic decomposition precursor in the reducing ambient having selected at least one of hydrogen gas, a hydrogen and nitrogen gas mix, reactive hydrogen, as said reducing chemical agent, and an ultra high vacuum substantially devoid of oxygen, to form a layer of tantalum metal as the layer of conductive material.

5. The method of claim 1, wherein the liquid metalorganic decomposition precursor is a tantalum metalorganic decomposition precursor, and wherein step B further includes a step of pyrolyzing the tantalum metalorganic decomposition precursor in the reducing ambient having reactive nitrogen, as said reducing chemical agent, to form a layer of tantalum nitride as the layer of conductive material.

6. The method of claim 1, wherein step A includes the step of:

applying the liquid metalorganic precursor onto the integrated circuit while the integrated circuit is spinning for improved uniformity in the application of the liquid metalorganic precursor.

7. The method of claim 6, wherein the liquid metalorganic decomposition precursor is applied by one of a liquid dispense process or an atomized spray process.

8. The method of claim 6, wherein step A further includes the steps of:

heating up the temperature of the integrated circuit; and blanketing the integrated circuit with an inert ambient to prevent oxidation.

9. The method of claim 1, wherein the layer of conductive material is a barrier layer deposited in an opening formed for a conductive interconnect, and wherein the method further includes the steps of:

filling the opening with a conductive fill material after the barrier layer has been deposited inside the opening.

10. The method of claim 9, wherein the conductive fill material is copper that is deposited from a liquid metalorganic decomposition deposition using a copper precursor.

* * * * *